United States Patent [19]
Kapusniak et al.

[11] Patent Number: 5,374,497
[45] Date of Patent: Dec. 20, 1994

[54] DONOR ELEMENT FOR USE IN A DRY COLOR PROOFING PROCESS

[75] Inventors: Richard J. Kapusniak, Webster; David A. Niemeyer, Rochester, both of N.Y.

[73] Assignee: Eastman Kodak Company, Rochester, N.Y.

[21] Appl. No.: 115,290

[22] Filed: Aug. 31, 1993

[51] Int. Cl.$^5$ .............................. G03C 1/49; G03C 5/08
[52] U.S. Cl. ..................... 430/254; 430/253; 430/261; 430/293; 430/616; 430/332; 430/333; 430/338; 430/346; 430/952
[58] Field of Search .............. 430/253, 254, 293, 616, 430/261, 332, 346, 333, 338, 952

[56] References Cited

U.S. PATENT DOCUMENTS

| | | | |
|---|---|---|---|
| 3,447,927 | 6/1969 | Bacon et al. | 430/616 |
| 3,511,658 | 5/1970 | Manko et al. | 430/333 |
| 3,622,320 | 11/1971 | Allen | 430/254 |
| 3,721,557 | 3/1973 | Inoue | 430/257 |
| 3,730,717 | 5/1973 | Chu et al. | 430/616 |
| 3,859,094 | 1/1975 | Franer et al. | 430/254 |
| 4,334,006 | 6/1982 | Kitajima et al. | 430/254 |
| 4,482,625 | 11/1984 | Namiki et al. | 430/143 |
| 4,502,065 | 2/1985 | Moriguchi et al. | 430/200 |
| 4,764,444 | 8/1988 | Simons et al. | 430/47 |
| 4,895,787 | 1/1990 | Platzer | 430/253 |
| 5,055,329 | 10/1991 | Namiki et al. | 428/42 |
| 5,075,722 | 12/1991 | Adolphson et al. | 355/77 |
| 5,108,868 | 4/1992 | Platzer | 430/143 |
| 5,145,760 | 9/1992 | Blanchet-Fincher et al. | 430/73 |

*Primary Examiner*—Charles L. Bowers, Jr.
*Assistant Examiner*—John A. McPherson
*Attorney, Agent, or Firm*—Alfred P. Lorenzo

[57] ABSTRACT

A print-out layer is incorporated in a donor element that is useful in a dry color proofing process in which a colored image is transferred from the donor element to a receiver. To achieve full color reproduction, images are transferred in succession and in register, to the receiver from donor elements, respectively containing yellow, magenta, cyan and black colorants. A visible image is formed in the print-out layer as a result of imagewise exposure of the donor element to activating radiation and is utilized to facilitate visual registration in forming the multicolor image on the receiver.

26 Claims, 3 Drawing Sheets

DONOR ELEMENT FOR USE IN A DRY COLOR PROOFING PROCESS

FIELD OF THE INVENTION

This invention relates in general to the color proofing art and in particular to processes of dry color proofing and elements utilized therein. More specifically, this invention relates to a novel donor element for use in a dry color proofing process.

BACKGROUND OF THE INVENTION

Prepress color proofing systems are in widespread use in the printing industry. In a typical process, a multicolor original is separated into individual transparencies, called color separations, for the three primary colors and for black. The separation process can be carried out in a number of well-known ways; for example, a graphic arts scanner can be used to create the color separations. In some instances, more than four color separations are employed. A color proof, called an off-press proof or a prepress proof, is then prepared from the color separations. The color proof is used by the printer to check color balance and other important quality control parameters. Generally speaking, off-press color proofs are made by one of three methods; namely (1) an overlay process which employs an image on a separate base for each color, (2) a single sheet process is which the separate color images are combined on a single base, and (3) a digital method in which the images are produced directly on a single base from digital data. The overlay process and single sheet process are discussed in some detail in U.S. Pat. No. 4,895,787 which points out that the single sheet process is greatly preferred because the superposed supports of the overlay process drastically alter the appearance of the color proof.

U.S. Pat. No. 3,622,320, issued Nov. 23, 1971, describes a color proofing process of the single sheet type that is highly advantageous in that it is simple and convenient to use and particularly in that it is a dry process which does not require the use of processing solutions. As described in the '320 patent, the color-proofing process utilizes two or more light-sensitive donor elements each of which contains a different dispersed colorant. The donor elements employ a light-sensitive resin which has a tackifying point that is raised by light exposure, i.e., a resin that is photohardenable. The imagewise-exposed donor element is pressed into contact with a receiver while heated to a temperature greater than the tackifying point before exposure but less than the tackifying point in the exposed, areas, whereby the colored resin transfers from the unexposed areas to the receiver. Second, third and subsequent donor elements, each containing a different colorant, are also exposed and the image therefrom is transferred, in exact registration, to the same receiver. For full color reproduction, it is customary to expose and transfer images from donor elements containing, respectively, yellow, magenta, cyan and black colorants. Commonly, the donor elements are exposed by use of a set of half-tone color separation positives.

A full color proof is typically made by transfer of the black image, followed by the magenta image, then the cyan image and finally the yellow image; although the order of transfer is not critical and a different order can also be used depending on operator preference. Between each transfer step, the transferred image can be hardened by exposure to a suitable light source in order to prevent back transfer, i.e., transfer to a subsequently applied donor element.

In lieu of using a photohardenable resin, acceptable results in a single sheet process can also be achieved by using a resin which is phototackifiable. With this type of resin, the exposed areas will be more tacky at the transfer temperature than the unexposed areas and, accordingly, the colored resin will transfer from the exposed areas to the receiver. In this instance, the donor elements can be exposed by use of a set of half-tone color separation negatives. Phototackifiable compositions and their use in a single sheet process are described, for example, in U.S. Pat. No. 5,108,868.

Whether photohardenable or phototackifiable resins are used, in either instance the process utilizes heat to increase the difference in surface adhesion between exposed and unexposed areas and pressure to bring about effective image transfer.

To achieve the imagewise transfer of the colored resin in the process of the '320 patent, the exposed donor element is placed in contact with the receiver, the sandwich that is so formed is passed between a pair of heated pressure rollers, and the donor element is separated from the receiver which then carries the transferred image. Separation of the donor element from the receiver is usually accomplished by a manual peeling step, but can, if desired, be accomplished automatically through the functioning of the laminator. After the first image is transferred, it is critical that there be exact registration of each of the subsequently transferred images.

A very significant disadvantage of the dry color proofing system of the '320 patent is the difficulty that is encountered in accurately registering the images that are successively applied to the receiver. A common way of doing this is by means of a pin registration system, but this is inconvenient to use and often insufficiently accurate. Moreover, if an accurate pin registration system is devised it will add significantly to the cost of the color proofing process and still will not easily permit the preparation of "scatter proofs", namely proofs using one large sheet for the creation of multiple proofs of small size.

The present invention is directed to the objective of providing an improved donor element for use in a dry color proofing process of the type described hereinabove; in particular an improved donor element that avoids the need to use pin registration.

SUMMARY OF THE INVENTION

This invention provides an improved multilayer donor element for use in a dry color proofing process in which a colored image is transferred from the donor element to a receiver by a process of lamination. The improved multilayer donor element contains a colorant, dispersed throughout at least one layer which undergoes imagewise transfer, and comprises:
  (1) a support;
  (2) a photosensitive imaging layer comprised of a photohardenable or phototackifiable composition whose tackifying temperature is selectively changeable by imagewise exposure of the donor element to activating radiation; and
  (3) a print-out layer comprised of a print-out composition that functions to form a visible image as a result of the imagewise exposure.

The ability of the donor element of this invention to form a visible print-out image enables visual registration of the images as they are successively applied to the receiver. This entirely obviates the need for pin registration and provides a simple, convenient and highly accurate means of achieving the accurate registration of images that is essential to the functioning of the process.

DETAILED DESCRIPTION OF THE INVENTION

Donor elements within the scope of this invention can utilize any of a wide variety of supports, colorants, imaging compositions and print-out compositions. The essential requirements are that the print-out image be sufficiently visible to facilitate effective visual registration as the images are successively laminated on top of each other, and that the imaging layer functions effectively to transfer the colored image to the receiver.

The donor element of this invention comprises at least two layers on a support, namely a print-out layer and an imaging layer as hereinabove described, but can also include additional layers as described in more detail hereinafter. The colorant can be either a dye or a pigment and it is not restricted to a particular layer except that it should ordinarily not be included in the print-out layer as it will interfere with the functioning of this layer. The print-out layer is not transferred to the receiver, its only function being to show where photoexposure has occurred.

If desired, all of the donor elements used in the color proofing process, for example, yellow, magenta, cyan and black donor elements, can be simultaneously exposed in order to reduce the total time needed to complete the preparation of the off-press proof. This is an important advantage of the donor elements and dry color proofing process of this invention as compared to prior art processes in which each exposure must be done after the respective lamination step.

Any of a wide variety of dimensionally stable polymeric films can be utilized as the support for the donor elements of this invention.

Typical of useful polymeric film supports are films of cellulose esters such as cellulose diacetate or cellulose triacetate, polystyrene, polyamide, homo- and copolymers of vinyl chloride, poly(vinylacetal), polycarbonate, homo- and copolymers of olefins, such as polyethylene and polypropylene, and polyesters of dibasic aromatic carboxylic acids with divalent alcohols, such as poly(ethylene terephthalate) and poly(ethylene naphthalate).

Polyester films, such as films of polyethylene terephthalate, have many advantageous properties, such as excellent strength and dimensional stability, which render them especially advantageous for use as supports in the present invention. Such films can be coated with both a polymeric sub, e.g., a vinylidene chloride/methyl acrylate/itaconic acid terpolymer, and a gel sub as described in U.S. Pat. No. 3,271,178. Such use of subbing layers is well known in the art for the purpose of rendering the polyester film receptive to coating of functional layers.

The thickness of the support is not critical. Support thicknesses of from 0.04 to 0.4 millimeters can be employed, for example, with satisfactory results.

As described hereinabove, the imaging layer utilized in the donor elements of this invention can be a photohardenable layer. Photohardenable layers containing photopolymerizable monomers and photohardenable layers containing photocross-linkable polymers are both well known in the art.

Exemplary photopolymerizable monomers include acrylic monomers, particularly bis-, tris- or tetrakisacrylates or methacrylates. Typically, the photopolymerizable monomer is incorporated in the layer together with a compatible polymeric binder. Examples of suitable binders for this purpose include homopolymers and copolymers of acrylates and methacrylates, polyvinyl acetals, polyamides and cellulose esters.

In the present invention, it is preferred to use photocrosslinkable polymers to form a photohardenable imaging layer. Particularly preferred are photocrosslinkable polymers, such as polyesters, containing the photosensitive group:

as an integral part of the polymer backbone. For example, preferred photocrosslinkable polymers are prepared from one or more compounds represented by the following formulae:

where $R^2$ is one or more alkyl of 1 to 6 carbon atoms, aryl of 6 to 12 carbon atoms, aralkyl of 7 to 20 carbon atoms, alkoxy of 1 to 6 carbon atoms, nitro, amino, acrylic, carboxyl, hydrogen or halo and is chosen to provide at least one condensation site; and $R^3$ is hydroxy, alkoxy of 1 to 6 carbon atoms, halo or oxy if the compound is an acid anhydride. A preferred compound is p-phenylene diacrylic acid or a functional equivalent thereof. These and other useful compounds are described in U.S. Pat. No. 3,030,208 (issued Apr. 17, 1962 to Schellenberg et al); U.S. Pat. No. 3,702,765 (issued Nov. 14, 1972 to Laakso); and U.S. Pat. No. 3,622,320 (issued Nov. 23, 1971 to Allen), the disclosures of which are incorporated herein by reference

$R^3$ is as defined above, and $R^4$ is alkylidene of 1 to 4 carbon atoms, aralkylidene of 7 to 16 carbon atoms, a 5- to 6-membered heterocyclic ring. Particularly useful compounds of formula (B) are cinnamylidenemalonic acid, 2-butenylidenemalonic acid, 3-pentenylidenemalonic acid, o-nitrocinnamylidenemalonic acid, naphthylallylidenemalonic acid, 2-furfurylideneethylidenemalonic acid and functional equivalents thereof. These and other useful compounds are described in U.S. Pat. No. 3,674,745 (issued Jul. 4, 1972 to Philipot et al), the disclosure of which is incorporated herein by reference.

$R^3$ is as defined above; and $R^5$ is hydrogen or methyl. Particularly useful compounds of formula (C) are trans, trans-muconic acid, cis-transmuconic acid, cis, cis-muconic acid, α,α'-cis, trans-dimethylmuconic acid, α,α'-cis, cis-dimethylmuconic acid and functional equivalents thereof. These and other useful compounds are described in U.S. Pat. No. 3,615,434 (issued Oct. 26, 1971 to McConkey), the disclosure of which is incorporated herein by reference.

$R^3$ is as defined above; and Z represents the atoms necessary to form an unsaturated bridged or unbridged carbocyclic nucleus of 6 or 7 carbon atoms. Such nucleus can be substituted or unsubstituted. Particularly useful compounds of formula (D) are 4-cyclohexene-1,2-dicarboxylic acid, 5-norbornene-2,3-dicarbocylic acid, hexachloro-5[2:2:1]-bicycloheptene-2,3-dicarboxylic acid and functional equivalents thereof. These and other useful compounds are described in Canadian Patent No. 824,096 (issued Sep. 30, 1969 to Mench et al), the disclosure of which is incorporated herein by reference.

$R^3$ is as defined above; and $R^6$ is hydrogen, alkyl of 1 to 12 carbon atoms, cycloalkyl of 5 to 12 carbon atoms or aryl of 6 to 12 carbon atoms. $R^6$ can be substituted where possible, with such substituents as do not interefere with the condensation reaction, such as halo, nitro, aryl, alkoxy, aryloxy, etc. The carbonyl groups are attached to the cyclohexadiene nucleus meta or para to each other, and preferably para. Particularly useful compounds of formula (E) are 1,3-cyclo-hexadiene-1,4-dicarboxylic acid, 1,3-cyclo-hexadiene-1,3-dicarboxylic acid, 1,5-cyclo-hexadiene-1,4-dicarboxylic acid and functional equivalents thereof. These and other useful compounds are described in Belgian Patent No. 754,892 (issued Oct. 15, 1970), the disclosure of which is incorporated herein by reference.

Preferred photocrosslinkable polymers for use in this invention are p-phenylene diacrylate polyesters.

The photohardenable compositions described in U.S. Pat. No. 3,622,320 are of particular utility in the novel donor element of this invention. These compositions are substantially non-tacky at room temperature but have a tackifying temperature, i.e., the temperature at which the composition becomes sensually tacky, of about 50° C. to about 200° C. They are photocrosslinkable polyesters having a crystallinity of about 10 percent to about 80 percent as determined by X-ray diffraction and a glass transition temperature of less than about 30° C. The polyesters contain as recurring units (a) 50 mole percent of at least one dihydric alcohol moiety and (b) 50 mole percent of at least two dicarboyxlic acid moieties esterified with the dihydric alcohol moiety, about 5 to 45 mole percent of the dicarboxylic acid moieties containing as an integral portion a —CH=CH—CO— grouping.

As described hereinabove, the imaging layer utilized in the donor elements of this invention can be a phototackifiable layer. Phototackifiable compositions are well known in the art and include those that are photodepolymerizable and those that are photoscissionable. Such compositions are describe, for example, in "Imaging Processes and Materials", Neblette's Eighth Edition, published by Van Nostrand Reinhold, New York, N.Y., 1989. Phototackifiable compositions are also described, for example, in U.S. Pat. No. 5,108,868.

The thickness of the imaging layer is critical. Dry layer thicknesses in the range of from about 1 to about 10 micrometers can be employed, for example, with satisfactory results.

Imaging layers utilized in the donor elements of this invention typically include a spectral sensitizer which serves to sensitize the composition to the desired portion of the spectrum. Suitable spectral sensitizers include anthrones, nitro sensitizers, triphenylmethanes, quinones, cyanine dyes, naphthones, pyrytium and thiapyrylium salts, furanones, anthraquinones, 3-ketocoumarins, thiazoles, thiazolines, naphthothiazolines, quinalizones, and others described in U.S. Pat. No. 4,139,390 and references noted therein. Preferred sensitizers include the 3-ketocoumarins described in U.S. Pat. No. 4,147,552 and the thiazoline sensitizers of U.S. Pat. No. 4,062,686. Such sensitizers can be present in the imaging composition in effective sensitizing amounts easily determined by one of ordinary skill in the art.

Dyes or pigments can be utilized as the colorant in the donor element. The colorant is typically incorporated in the imaging layer but all or part of the colorant can be incorporated in layers other than the imaging layer in certain embodiments as hereinafter described.

The colorant must be present in at least one layer which undergoes imagewise transfer in the lamination process. Typically, it is dispersed throughout the imaging layer, i.e., the photohardenable or phototackifiable layer. In some embodiments, more than one such layer can be included in the donor element and the colorant can be present in only one of these layers. As a further example, the colorant can be incorporated, in whole or in part, in a release layer which transfers imagewise along with the photohardenable or phototackifiable layer.

Colorants useful in the donor elements of this invention include pigments utilized in printing inks as well as dyes and pigments commonly employed in colored toner particles that are used in electrophotographic processes.

Colorant concentration in the donor elements of this invention can vary widely as desired. A typical concentration of colorant in the imaging layer is in the range of from about 5 to about 15 percent by weight.

Examples of particularly suitable colorants for use in this invention are given in U.S. Pat. No. 3,622,320 which refers to the use of MONOLITE Fast Black BS (Imperial Chemical Industries) in the black donor, MONOLITE Fast Yellow GTS (Imperial Chemical Industries) in the yellow donor, RUBINE Tone 4BS (Imperial Chemical Industries) or FASTEL Pink B Sumra (Imperial Chemical Industries) in the magenta donor and HELIOGEN Blue LBG (Badische Anilin & Soda-Fabrik A. G.) or MONASTRAL Fast Blue GS (Imperial Chemical Industries) in the cyan donor.

Useful pigments available from HOECHST A. G. are described in U.S. Pat. No. 5,108,868. These include Permanent Yellow G (C.I. 21095), Permanent Yellow GR (C.I. 21100), Permanent Yellow DHG (C.I. 21090), Permanent Rubine LGB (C.I. 15850), Permanent Pink F3B (C.I. 12433), Hostaperm Pink E (C. I. 73915), Hostamerm Red Violet ER (C.I. 46500), Permanent Carmine FBB (C.I. 12485), Hostaperm Blue B2G (C.I. 74160), Hostaperm Blue A2R (C.I. 74160) and Printex 25.

A preferred pigment for use in the magenta donor is Litho Rubine D 4566 DD which is manufactured by Badische Anilin & Soda-Fabrik A.G.

Still other useful colorants include Hansa Yellow G (C.I. 11680), Nigrosine Spirit Soluble (C.I. 50415), Chromogen Black ET00 (C.I. 14645), Rhodamine B (C.I. 45170), Fuchsine N (C.I. 42510) and C.I. Basic Blue 9 (C.I. 52015).

In the dry color proofing process in which the donor elements of this invention are utilized, the proof is constructed by successively laminating the color records, typically four in number, namely, cyan, magenta, yellow, and black, on top of one another. To accomplish this successfully, the records must be exactly registered in each successive lamination step. Such exact registration is accomplished in this invention by use of the print-out layer which greatly facilitates visual registration and avoids the need for the costly and complex pin registration systems of the prior art. Visual registration can be carried out using a transmission mode, for example with the aid of a light table, or by using a reflection mode.

In this invention, the print-out layer does not undergo imagewise transfer to the receiver. It is a layer which is separate and distinct from any layer which undergoes imagewise transfer to the receiver. The sole purpose of the print-out layer is to provide a visual image which facilitates registration.

A wide variety of different print-out compositions can be used to form the print-out layer. A very common type is a composition based on the use of a leuco dye. Another suitable way of obtaining a print-out image is by use of a silver halide photographic emulsion of the print-out type, that is, an emulsion that produces a visible image by the direct action of light.

Print-out compositions based on the use of leuco dyes are well known and widely used in a variety of radiation-sensitive compositions. Thus, for example, manufacturers of lithographic printing plates typically incorporate a print-out composition comprising a leuco dye in a radiation-sensitive layer of the plate which will produce an optical density difference upon exposure to activating radiation. This enables the customer to see the exposed image on the printing plate before it is processed.

Examples of print-out compositions based on the use of leuco dyes include the compositions of Altland et al, U.S. Pat. No. 4,425,424 and the compositions of Mitchell et al, U.S. Pat. No. 5,141,842. Altland et al describe print-out compositions comprising a leuco form of a dye having one or more removable hydrogen atoms, the removal of which forms a compound colored differently from the leuco form and a sulfonyloxy-N photooxidant that is capable of converting the leuco dye to the differently colored form when the composition is exposed to activating radiation. Mitchell et al describe an improved print-out composition, having enhanced photo-efficiency, which comprises a leuco form of a dye, a photooxidant which has a photoscissionable nitrogen-oxygen bond and a heteroaromatic amine N-oxide.

The compositions of both the Altland et al and Mitchell et al patents, as well as many other known print-out compositions based on the use of leuco dyes, are useful in the print-out layer employed in invention.

Well known leuco dyes for use in print-out compositions include aminotriarylmethanes, for example, 4,4',4''-methylidenetris(N,N-dipropylaniline) and 4,4',4''-methylidenetris(N,N-dimethylaniline); aminoxanthenes such as 3,6-bis(dimethylamino)-9-(p-dimethylaminophenyl)xanthene and 3,6-bis(diethylamino)-9-

(p-dimethylaminophenyl)xanthene; aminothioxanthenes; aminophenoxazines; aminophenothiazines; aminodihydrophenazines, such as 3,6-bis(dimethylamino)-9-(p-dimethylaminophenyl)-phenazine and 3,7-bis(dimethylamino)5,10-dihydro-5-phenylphenazine; aminodiphenylmethanes, such as 1,1-bis(p-dimethylaminophenyl)methane; leuco indamines; aminohydrocinnamic acids such as 4-(p-chloroanilino)-α,β-dicyanohydrocinnamic acid, methyl ester and 4-anilino-α,β-dicyanohydrocinnamic acid, methyl ester; hydrazines such as 1-(2-naphthyl)-2-phenylhydrazine and 1-(p-dimethylaminophenyl)-2-(2-pyridyl)hydrazine; leuco indigoid dyes; amino-2,3-dihydroanthraquinones; and phenethylanilines such as N-(2-cyanoethyl)-p-phenethylaniline and N,N-diethyl-p-phenylethylaniline.

Examples of print-out systems based on the use of a leuco dye and a photooxidant are described in numerous patents such as, for example, U.S. Pat. No. 3,359,109, 3,481,739, 3,827,887, 4,251,619, 4,891,301, 4,940,649 and 4,962,011.

Print-out systems which produce a colored print-out image in response to photogenerated acid are also well known. An example of such a system is described in U.S. Pat. No. 4,923,781.

Print-out layers based on the use of leuco dyes and photooxidants additionally contain a suitable polymeric binder. Examples of the many different polymeric binders suitable for use in the print-out layers employed in this invention include cellulose esters, polyesters, polyvinyl acetals and polyvinyl acetate.

Further examples of print-out systems useful in this invention include those described in Chapter 8 of Kosar, "Light-Sensitive Systems" published by John Wiley & Sons, Inc., New York, N.Y., 1965.

Print-out silver halide emulsions are well known in the photographic art. These emulsions produce a visible image by the direct action of light with no subsequent processing being required. They typically utilize one or more of the following features:

(a) silver halide grains formed in the presence of metal salts or ions;
(b) surface-desensitized fogged silver halide grains;
(c) halogen acceptors, optionally in combination with aldehydes or development restrainers;
(d) gold compounds;
(e) acid-substituted compounds, especially salt or complex-forming dicarboxylic acids; and
(f) iodide-releasing compounds.

Examples of the numerous patents describing print-out silver halide emulsions include U.S. Pat. No. 3,189,456, 3,531,291, 3,547,647, 3,574,625, 3,650,758, 3,840,372 and 3,844,789.

The use of a print-out silver halide emulsion layer is particularly preferred in this invention. Such emulsions normally utilize a hydrophilic colloid such as gelatin as the binder and require the use of an appropriately subbed support to provide good adhesion between the support and the print-out layer. Advantages of using a print-out silver halide emulsion layer include the non-migratory characteristics of silver halide grains, the desirable adhesive and surface energy characteristics of hydrophilic colloids such as gelatin, and the fact that such layers are thermally stable, coatable from aqueous composition and capable of yielding an image of neutral tone and good contrast.

The donor element of this invention can designed to function by cohesive failure, i.e., the fracturing of a layer at a point within its thickness, or to function by adhesive failure, i.e., separation at an interface between layers. Cohesive failure is the basis on which the donor elements of the '320 patent function. Donor elements which function by cohesive failure typically require that the delamination step occur while the donor element is hot. This is referred to as a "hot peel" process. Donor elements which function by adhesive failure permit carrying out of the delamination step after the donor element has cooled. This is referred to as a "cold peel" process.

In the process of the '320 patent, the peel-apart step is carried out while the donor element is still hot from its passage through the heated rollers of the laminator. The colored imaging layer fractures as a result of cohesive failure, with such fracturing usually taking place near the mid-point of its thickness. Thus, only a portion of the total colorant is transferred to the receiver and a portion is left behind with the donor element to be discarded.

Rather than relying on cohesive failure as is done in the '320 patent, a release layer can be utilized to provide for adhesive failure. Thus, with a donor element comprised of a support, a print-out layer, a release layer and an imaging layer, the entire thickness of the imaging layer can be transferred rather than having fracture occur near the mid-point of the imaging layer. Rather than cohesive failure within the imaging layer, there can be adhesive failure at the interface of the release layer and the imaging layer (see FIG. 9 herein) or at the interface of the release layer and the print-out layer (see FIG. 10 herein) as desired. An advantage of this design is that it makes better utilization of the colorant since none is left behind to be discarded with the donor element. The choice of which interface provides adhesive failure is determined by the choice of the components making up the respective layers. Thus, for example, a release layer can be designed so it either transfers imagewise together with the imaging layer or remains behind with the donor. In the former case, separation occurs between the release layer and the print-out layer since the imaging layer functions to pull the release layer off the print-out layer in an imagewise fashion. Colorant can be incorporated only in the imaging layer or only in the release layer or in both the imaging layer and the release layer, as desired. In the latter case, separation occurs between the release layer and the imaging layer and there would ordinarily be no reason to incorporate colorant in the release layer.

Figure 3:
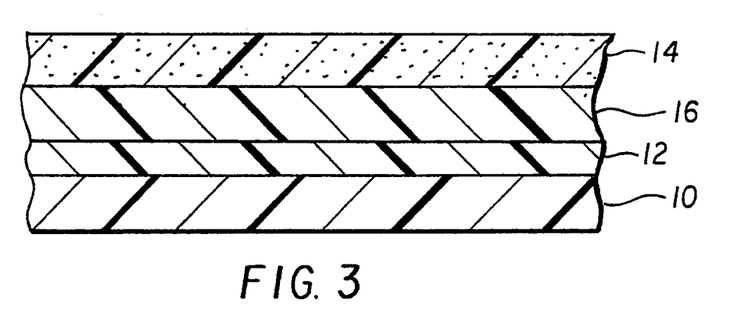
FIG. 3 is a cross-sectional view of a donor element of this invention comprised of a support having a print-out layer on one surface thereof, a first imaging layer that is free of colorant overlying the print-out layer and a second imaging layer that contains a colorant overlying the first imaging layer.
Figure 8:
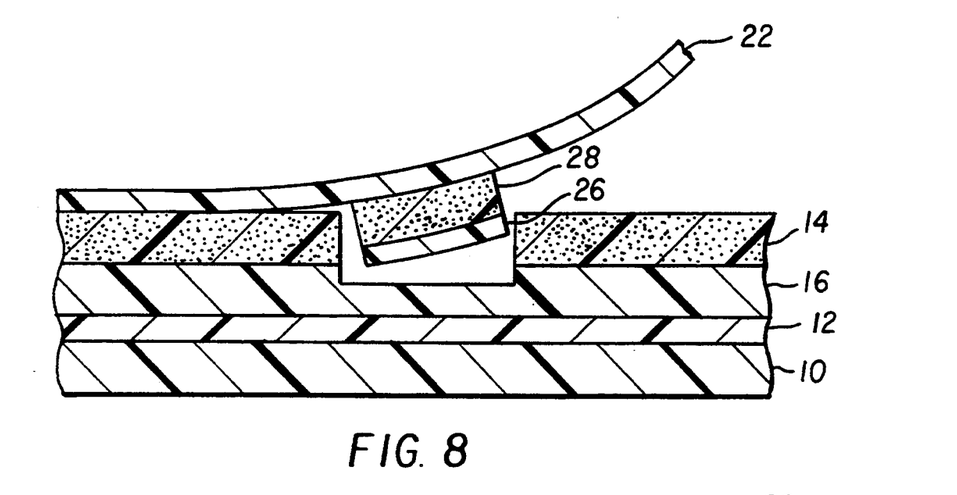
FIG. 8 is a cross-sectional view of the donor element of FIG. 3 in contact with a receiver and illustrates imagewise transfer to the receiver by cohesive failure within the first imaging layer and resulting transfer of the entire thickness of the second imaging layer.

The cohesive failure described in the '320 patent is acceptable as long as the fracturing occurs at a point within the layer thickness such that a sufficient amount of the colored layer is transferred to give the required image density. It does not however make the most efficient use of the colorant since much of the colorant remains behind with the donor and is wasted. In a preferred embodiment of the present invention that also relies on cohesive failure, the donor element comprises a support having on one side thereof, in order, a print-out layer, a first photohardenable imaging layer that is free of colorant and a second photohardenable imaging layer that contains colorant. This embodiment of the invention is illustrated in FIGS. 3 and 8. An advantage of this embodiment is that the first photohardenable imaging layer, which is interposed between the print-out layer and the second photohardenable imaging layer, prevents any adverse interaction between the colorant and the print-out composition. A second advantage is that upon transfer of the image to the receiver, fracture typically occurs within the first photohardenable imaging layer so that all colorant is transferred rather than a portion being left behind. This ensures that adequate image density is obtained. The thicknesses of the first and second photohardenable imaging layers should be so selected as to promote fracturing within the first photohardenable layer. Typically, the thickness of the first photohardenable imaging layer will be considerably greater than the thickness of the second photohardenable imaging layer. Preferably the thickness of the first photohardenable imaging layer is at least twice that of the second photohardenable imaging layer.

Materials which are suitable for use in forming a release layer will depend on the materials used to prepare the imaging layer and the print-out layer. Typically, suitable release layers can be prepared from polymers such as polyesters, polyamides, cellulose esters, polyvinyl acetals and gelatin.

Exposure of the donor elements of this invention can be carried out by use of a conventional vacuum printing frame. If desired, all of the donor elements required to form the final multicolor image can be exposed simultaneously, as hereinbefore described.

In the present invention, the donor elements can be used to form the multicolor image on any suitable paper stock that is appropriate for use as a color proofing stock. However, it is generally preferred to use an intermediate element to which the images are transferred from the donor elements. The intermediate element is then used as a means to transfer the multicolor image to the color proofing stock. Use of an intermediate element in this manner permits the formation of a right-reading image, i.e., an image that is not laterally reversed. The essential requirements for the intermediate element are that it be capable of adequately discriminating between exposed and unexposed areas of the donor element to permit effective imagewise transfer and that it be capable of reliably releasing the multicolor image to the color proofing stock. The intermediate element must also have good dimensional stability that will enable it to withstand the succession of lamination steps which it must undergo without excessive dimensional change.

Suitable materials for use as an intermediate element include any of a wide variety of polymeric films such as, for example, polyesters, polyvinyl acetates, polyacrylates, polymethylmethacrylates and polystyrenes. If desired, the intermediate can be comprised of a film base that has been coated with a thin layer that transfers along with the multicolor image. A typical example would be polyethylene terephthlate film coated with vinyl acetate.

Use of an intermediate in the manner described above in a color proofing process is well known in the color proofing art and is described, for example, in U.S. Pat. No. 5,055,329.

The donor element of this invention can be exposed through the back in order to allow direct transfer to the final stock, i.e., to avoid the use of an intermediate element, and still get a right-reading image. Exposure through the back is facilitated by using a very thin support for the donor element.

The laminating unit used with the donor elements of this invention can be any suitable device which provides the necessary heat and pressure to transfer the images from the imagewise exposed donor elements to the receiver. Most typically, heated pressure rollers are used to carry out the lamination.

Laminating devices for use in laminating photosensitive elements employed in color proofing are well known in the art and are described, for example, in U.S. Pat. Nos. 4,659,927 and 5,075,722.

A suitable transport speed in the laminating unit ranges from about 0.5 to about 1.5 centimeters per second. Typical temperatures in the roller nip at the point where lamination occurs are in the range of from about 75° C. to about 115° C.

Lamination pressures suitable for use in the method of this invention can be readily determined in terms of "nip pressure" as measured in centimeters. As used herein, the term "nip pressure" refers to the width over which the heated rubber rollers of the laminator are in intimate contact. This can be determined by inserting the donor element, while in superposed contact with a low density polyethylene film, between the heated rubber rollers, turning of the drive motor that turns the rollers, and locking the rollers together. A clearly visible stripe forms where the donor element and the low density polyethylene film were in intimate contact. The width of this stripe is measured as the "nip pressure." In the method of this invention, it is preferred that the "nip pressure" be in the range of from about 0.3 to about 0.9 centimeters.

The laminating unit can be designed for automatic peeling or, to simplify construction and reduce costs, can rely on manual peeling that is performed by the operator. To facilitate manual peeling, a leader strip of suitable sheet material can be adhered to the donor/receiver sandwich.

The term "receiver" as used herein refers to the element to which the successive transfers are made from the donor elements. The receiver can be the final color proofing stock or an intermediate element as described hereinabove.

It is preferred in this invention to use a carrier plate to facilitate the lamination process. A carrier plate acts as a support for the donor/receiver sandwich during lamination and facilitates transpoint of the sandwich through the rollers of the laminator, e.g., it prevents the sandwich from wrapping around the rollers and reduces the risk of the formation of ripples in the donor element. It can also act to limit the transfer of heat from the bottom roller and thereby aid in maintaining dimensional stability. Suitable carrier plates include metal plates, e.g., aluminum coated with a fluoropolymer, clear plastic plates, and plates formed from thick paper card stock.

The intermediate can be used repeatedly, if desired, so as to reduce the volume of waste that is generated. The intermediate can also serve as the carrier plate. A material which is particularly useful as an intermediate which can also serve as a carrier plate is a thick sheet of polyester having a high loading of barium sulfate particles to provide opacity. Polyester materials of this type are well known in the art and are described, for example, in U.S. Pat. No. 4,780,402.

To facilitate manufacture and packaging of the donor elements of this invention, interleaving materials can be utilized. As an alternative to the use of interleaving, the support can be coated with a release layer. Release coatings containing an organosiloxane polymer are particularly well suited for use as a release layer.

The donor element of this invention can be provided with an overcoat layer to protect it against dirt, abrasion, scratching and other damage. Use of such an overcoat layer can eliminate the need for interleaving in the packaging of donor elements. Use of an exposure step following the delamination step, as described, for example, in the '320 patent, can also be avoided by use of an overcoat layer. Examples of suitable materials for forming the overcoat layer include polyvinyl acetate, polyvinyl alcohol and cellulose esters.

In making color proofs of half-tone dot pattern images it is often useful to simulate the dot gain that will occur when prints are made with lithographic printing plates. A suitable means for doing this with color proofs generated by electrophotographic techniques is described in U.S. Pat. No. 4,657,831, issued Apr. 14, 1987. As described in the '831 patent, a composite transparent thermoplastic sheet of specified thickness and refractive index, referred to as a "pad", is laminated to the color proof with the result that optical density is increased in a manner which simulates the density increase caused by dot gain during lithographic printing. This same technique can be utilized in conjunction with the present invention by employing the "pad" described in the '831 patent with color proofs produced by use of the donor elements of this invention.

Processes of the type in which the donor elements of this invention are employed are commonly referred to as "peel development processes." For a detailed description of various "peel development processes" reference can be made to U.S. Pat. No. 4,334,006 and references cited therein.

It is particularly preferred in this invention to utilize a blend of a low Tg (glass transition temperature) crystalline photocrosslinkable polymer with a compatible high Tg amorphous photocrosslinkable polymer. Use of such blends provides broad process latitutde in regard to permissible variation in time, temperature and pressure of lamination. An example of a preferred low Tg crystalline photocrosslinkable polymer is the polymer hereinafter referred to as Photopolymer #2. An example of a preferred high Tg amorphous photocrosslinkable polymer is the polymer hereinafter referred to as Photopolymer #3. Suitable blends comprise 50 to 90 weight percent of the low Tg crystalline photocrosslinkable polymer and 10 to 50 weight percent of the high Tg amorphous photocrosslinkable polymer with an especially preferred blend comprising about 75 weight percent of the low Tg crystalline photocrosslinkable polymer and about 25 weight percent of the high Tg amorphous photocrosslinkable polymer. Such blends are particularly useful in donor elements adapted to function by cohesive failure in a hot peel process. With such blends there is less variation in $D_{max}$ and less tendency to form pinholes. Pinholing is a significant problem relating to the inability of the colorant to fill in the rough surface of clay coated paper or the inability of the photopolymer to adequately cover dirt particles with colorant during the hot peel lamination process. Blending of the photopolymers in the manner described above results in a more consistent hot peel process with splitting of the layer occurring at essentially the same position over a wide range of variation in lamination conditions. The excellent processing latitude with regard to lamination conditions facilitates the use of laminating devices of simple and inexpensive construction.

As hereinabove explained, in some instances the donor elements of this invention are utilized in a process which employs two lamination procedures, namely, (1) successive laminations from the donor elements to an intermediate element to form the full color image followed by (2) lamination of the full color image to the final receiver. In each instance, a choice of using a hot peel or a cold peel exists, as does a choice of a manual peel or an automatic peel. A useful combination, for example, is one employing a automatic hot peel for donor-intermediate delamination and a manual cold peel for intermediate-receiver delamination. Many other combinations are, of course, also feasible.

In a particularly preferred embodiment of this invention, the donor element comprises a support having a backing layer on one side thereof and having, in order, on the opposite side thereof:

(1) a print-out layer,
(2) a first photosensitive imaging layer comprised of a photohardenable composition whose tackifying temperature is selectively changeable by imagewise exposure of the donor element to activating radiation, and
(3) a second photosensitive imaging layer which is comprised of a photohardenable composition whose tackifying temperature is selectively changeable by imagewise exposure of the donor element to activating radiation and which has a colorant dispersed therein.

In the above described particularly preferred embodiment, the photohardenable compositions of the first and second imaging layers can be the same or different, as desired. The backing layer preferably comprises an organopolysiloxane polymer such as, for example, a dimethylpolysiloxane polymer.

The process of this invention is greatly superior to the color proofing processes of the prior art in that it is simple, inexpensive, requires no processing solutions or toners, provides for very accurate image registration by operators with only minimal skill requirements, permits simultaneous exposure of all color records, is well adapted to the preparation of scatter proofs and provides color proofs of remarkable quality.

Figure 1:
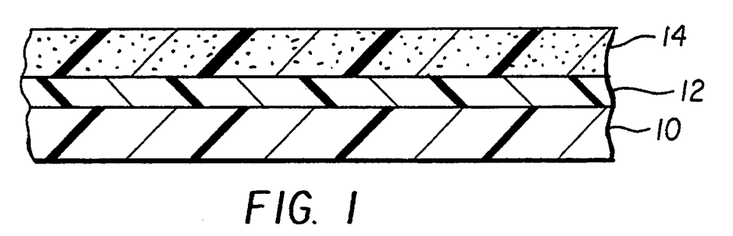
FIG. 1 is a cross-sectional view of a donor element of this invention comprised of a support having on one surface thereof a print-out layer and an imaging layer.

FIG. 1 is a cross-sectional view of a donor element within the scope of this invention. In this embodiment of the invention, a support 10 composed, for example, of a polyethylene terephthalate film, has disposed on one surface thereof a print-out layer 12, composed for example of a silver halide print-out-emulsion or of a dispersion of a leuco dye and a photooxidant in a polymeric binder, and an overlying imaging layer 14 composed of a photohardenable or phototackifiable composition having a colorant dispersed therein.

Figure 2:
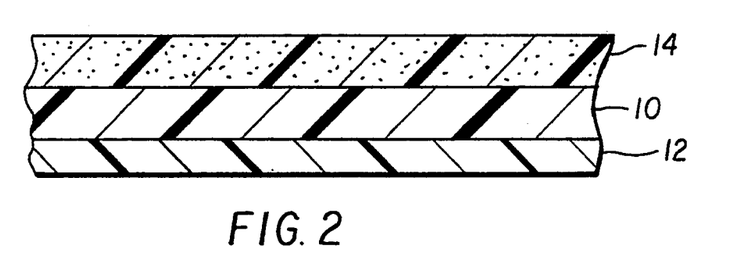
FIG. 2 is a cross-sectional view of a donor element of this invention comprised of a support having a print-out layer on one surface thereof and an imaging layer on the opposite surface.

FIG. 2 is a cross-sectional view of a modified form of the donor element of FIG. 1 in which the print-out layer 12 and imaging layer 14 are on opposite sides of support 10.

FIG. 3 is a cross-sectional view of an alternative embodiment comprised of support 10 having disposed on one surface thereof print-out layer 12, first imaging layer 16 that is composed of a photohardenable or phototackifiable composition but is free of colorant and second imaging layer 14 that is composed of a photohardenable or phototackifiable composition and contains a colorant.

Figure 4:
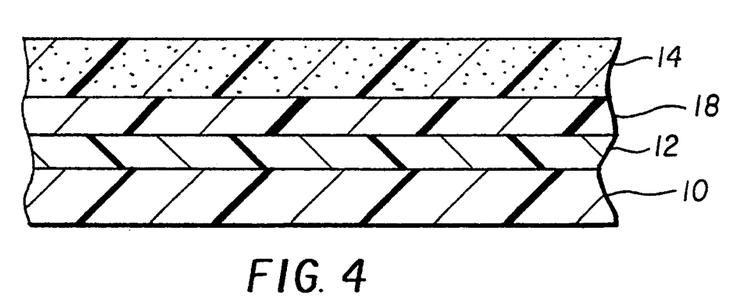
FIG. 4 is a cross-sectional view of a donor element of this invention comprised of a support having a print-out layer on one surface thereof, a release layer overlying the print-out layer and an imaging layer overlying the release layer.

FIG. 4 is a cross-sectional view of an alternative embodiment comprised of support 10 having disposed on one surface thereof print-out layer 12, release layer 18 and imaging layer 14.

Figure 5:
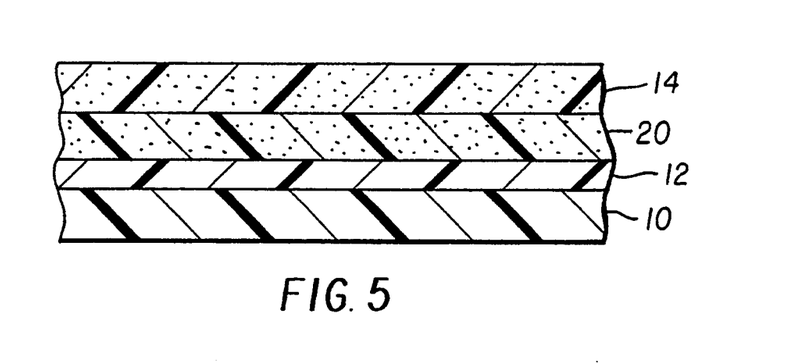
FIG. 5 is a cross-sectional view of a donor element of this invention comprised of a support having a print-out layer on one surface thereof, a release layer containing a colorant overlying the print-out layer and an imaging layer containing a colorant overlying the colored release layer.

FIG. 5 is a cross-sectional view of an alternative embodiment comprised of support 10 having disposed on one surface thereof print-out layer 12, release layer 20, which has a colorant dispersed therein, and imaging layer 14.

Figure 6:
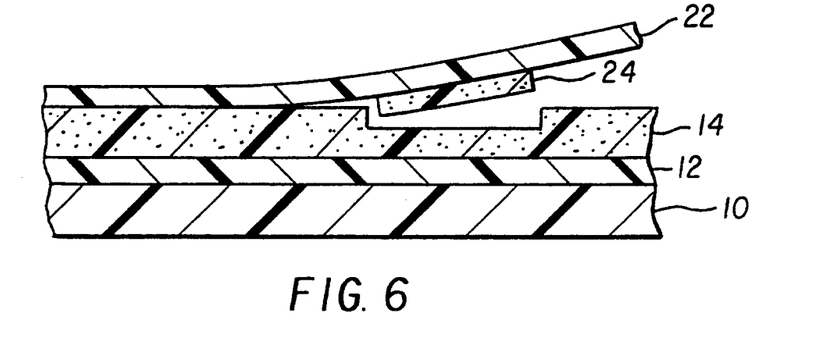
FIG. 6 is a cross-sectional view of the donor element of FIG. 1 in contact with a receiver and illustrates imagewise transfer to the receiver by cohesive failure within the imaging layer.

FIG. 6 is a cross-sectional view illustrating the donor element of FIG. 1, in association with receiver 22, undergoing the delamination or peeling step of the image assembly process. The imagewise-exposed donor element and receiver 22 have been laminated together by passage through heated pressure rollers and as receiver 22 is peeled from the donor element cohesive failure occurs near the mid-point of imaging layer 14 and a portion of imaging layer 14, designated 24, is transferred to receiver 22.

Figure 7:
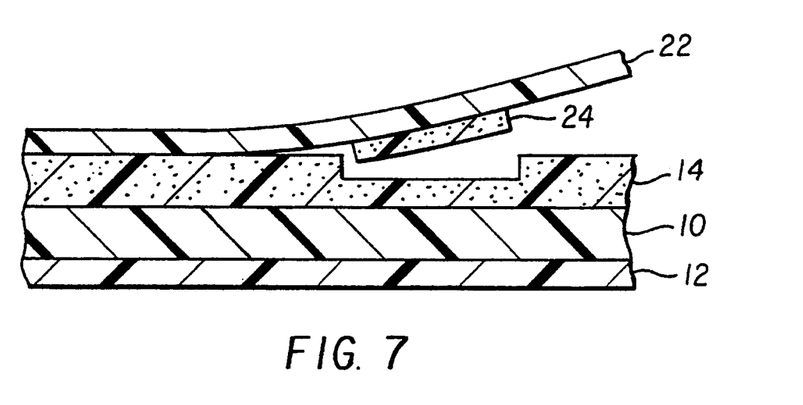
FIG. 7 is a cross-sectional view of the donor element of FIG. 2 in contact with a receiver and illustrates imagewise transfer to the receiver by cohesive failure within the imaging layer.

FIG. 7 is a cross-sectional view illustrating delamination of the donor element of FIG. 2. In this embodiment, support 10 has print-out layer 12 on one side and imaging layer 14 on the other side and cohesive failure within imaging layer 14 results in transfer of portion 24 to receiver 22.

FIG. 8 is a cross-sectional view illustrating delamination of the donor element of FIG. 3. In this embodiment of the invention, the donor element comprises support 10, print-out layer 12, first imaging layer 16 and second imaging layer 14. Cohesive failure occurs within imaging layer 16 and both a portion of layer 16, designated 26, and a portion of layer 14, designated 28, are transferred to receiver 22. Both layers 14 and 16 can be formed from the same photosensitive composition but all of the colorant needed to form the desired color record, i.e., the yellow, magenta, cyan or black record, is contained within imaging layer 14. In this manner, all colorant is transferred and none is left behind in areas where transfer occurs and, as a result, maximum image density is achieved.

Figure 9:
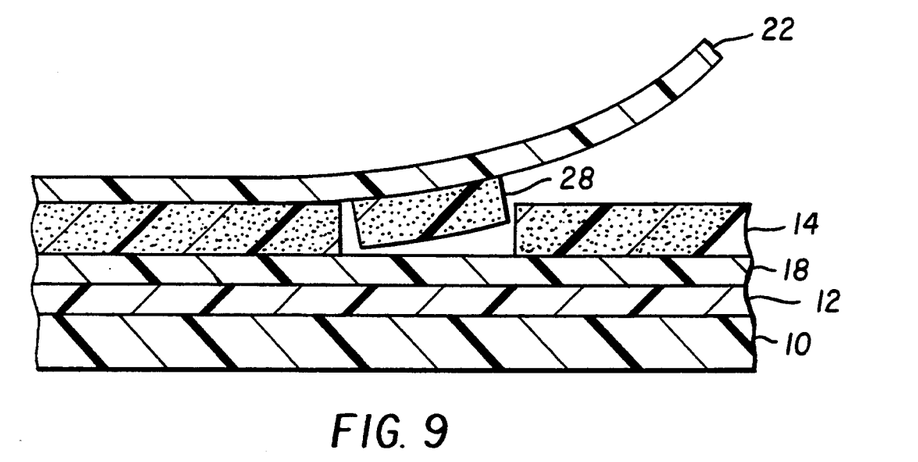
FIG. 9 is a cross-sectional view of the donor element of FIG. 4 in contact with a receiver and illustrates imagewise transfer to the receiver by adhesive failure at the interface between the release layer and the imaging layer.

FIG. 9 is a cross-sectional view illustrating delamination of the donor element of FIG. 4. In this embodiment of the invention, the donor element comprises support 10, print-out layer 12, release layer 18 and imaging layer 14. Adhesive failure occurs at the interface between release layer 18 and imaging layer 14 so that only portion 28 is transferred to receiver 22. This requires that the strength of the adhesive bond between layer 14 and layer 18 be less than the cohesive strength of layer 14. Since all colorant is in imaging layer 14, all colorant in the image area is transferred and none is left behind with the donor.

Figure 10:
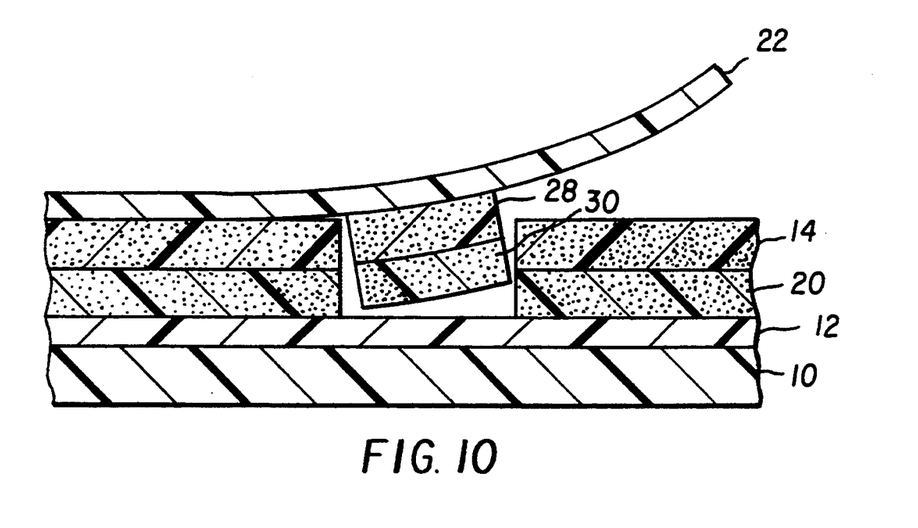
FIG. 10 is a cross-sectional view of the donor element of FIG. 5 in contact with a receiver and illustrates imagewise transfer to the receiver by adhesive failure at the interface between the release layer and the print-out layer.

FIG. 10 is a cross-sectional view illustrating delamination of the donor element of FIG. 5. In this embodiment of the invention, the donor element comprises support 10, print-out layer 12, colored release layer 20 and imaging layer 14. Adhesive failure occurs at the interface between colored release layer 20 and print-out layer 12 so that both portions 28 and 30 are transferred to receiver 22. This requires that the strength of the adhesive bond between colored release layer 20 and print-out layer 12 is less than the cohesive strength of layer 20, less than the adhesive bond strength between layer 20 and layer 14 and less than the cohesive strength of layer 14. Since colorant is present in both colored release layer 20 and imaging layer 14, the image density is determined by the amount of colorant in each of these layers and no colorant is left behind with the donor.

Many other variations and embodiments that are not illustrated are within the scope of the present invention since the essential requirements of the invention are only that the donor element include a colorant dispersed throughout at least one layer in which imagewise transfer occurs and that it comprise a support, a photosensitive imaging layer and a print-out layer. The print-out layer can be positioned on either side of the support, as desired, and additional layers such as auxiliary photosensitive layers, release layers and overcoat layers can optionally be included. No imagewise transfer occurs within the print-out layer, whose sole function is to form a visual image to facilitate registration.

As demonstrated by FIGS. 1-10, a wide variety of layer arrangements is feasible. Each of the techniques of cohesive failure and adhesive failure has its own advantages and disadvantages. With either technique, it is feasible to ensure that all colorant in the region undergoing imagewise transfer will be transferred to the receiver so as to ensure adequate density of the colored image. However, the use of a single colored imaging layer as in FIGS. 1 and 2, provides the simplest construction and is capable of providing adequate image density if a sufficiently thick imaging layer is employed. When more than one imaging layer is utilized, as in FIG. 3, the imaging layers can, but need not, employ the same photosensitive composition. FIG. 3 represents a particularly preferred embodiment of the invention which provides an optimum balance between simplicity of construction and performance features.

The invention is further illustrated by the following examples of its practice.

The examples refer to photopolymers and to coating solutions as hereinbelow described.

Photopolymer #1

A terpolymer, having an average molecular weight of 36000 (polystyrene equivalence) as measured by gel permeation chromatography, comprised of 46.5 mole % of monomer A, 3.5 mole % of monomer B and 50 mole % of monomer C wherein monomers A, B and C are of the following structure:

Photopolymer #2

A terpolymer having an average molecular weight of 18000 (polystyrene equivalence) as measured by gel permeation chromatography, comprised of 18.75 mole % of monomer A, 31.25 mole % of monomer D and 50 mole % of monomer E wherein monomers D and E are of the following structure:

Photopolymer #3

A copolymer, having an average molecular weight of 7000 (polystyrene equivalence) as measured by gel permeation chromatography, comprised of 50 mole % of monomer A and 50 mole % of monomer C.

Solution #1

This solution was prepared by dissolving 24 grams of cellulose acetate in 144 grams of acetone and 30 grams of dichloromethane and adding 600 milligrams of the sensitizer 3,3'-carbonylbis(5,7-dipropoxycoumarin), 600 milligrams of the photooxidant N-(4-chlorobenzenesulfonyloxy)-1,8-naphthalimide, 300 milligrams of the leuco dye tris(p-di-n-propylaminophenyl)methane, and 30 milligrams of the preservative dihydroanhydropiperidinohexose reductone.

Solution #2

This solution was prepared by dissolving 24 grams of cellulose acetate in 400 grams of acetone and adding 900 milligrams of the sensitizer 3-benzoyl-5,7-dipropoxycoumarin, 600 milligrams of the photooxidant N-(4-chlorobenzenesulfonyloxy)-1,8-naphthalimide and 300 milligrams of the leuco dye tris(p-di-n-propylaminophenyl)methane.

Solution #3

This solution was prepared by adding 2.6 grams of the pigment Lithol Rubine D4566DD, 17.4 grams of Photopolymer #1 and 230 grams of methylene chloride to a ceramic ball mill containing steel beads as the milling media, milling overnight and then adding 400 milligrams of the sensitizer 3-benzoyl-5,7-dipropoxycoumarin.

Solution #4

This solution was prepared by dissolving 28 grams of Photopolymer #2 in 322 grams of methylene chloride and adding 560 milligrams of the sensitizer 3-benzoyl-5,7-dipropoxycoumarin.

Solution #5

This solution was prepared by adding 2.6 grams of the pigment Lithol Rubine D4566DD, 17.4 grams of Photopolymer #2 and 230 grams of methylene chloride to a ceramic ball mill containing steel beads as the milling media, milling overnight and then adding 400 milligrams of the sensitizer 3-benzoyl-5,7-dipropoxycoumarin.

Solution #6

This solution was prepared by dissolving 21 grams of Photopolymer #2 and 7 grams of Photopolymer #3 in 319 grams of methylene chloride and adding 560 milligrams of the sensitizer 3-benzoyl-5,7-dipropoxycoumarin.

Solution #7

This solution was prepared by adding 1.8 grams of the pigment Lithol Rubine D4566DD, 1.8 grams of Photopolymer #2 and 113.4 grams of methylene chloride to a ceramic ball mill containing steel beads as the milling media, milling overnight, and then adding 5.85 grams of Photopolymer #2, 2.55 grams of Photopolymer #3, 25.2 grams of methylene chloride and 205 milligrams of the sensitizer 3-benzoyl-5,7-dipropoxycoumarin.

Solution #8

This solution was prepared by dispersing in gelatin 0.257 micron edge length cubic AgClBr (90/10) grains, iridium doped at 20.04 mg/Ag mole (as potassium tetrachlorodiaquoiridate III) and chemically sensitized with thioureadioxide at 1.767 mg/Ag mole for 60 minutes at 66° C. Gelatin and water were added to give a concentration of 57.1 grams gelatin per Ag mole and 921 grams of emulsion per Ag mole.

Solution #9

This solution was prepared by adding 4.8 grams of the pigment Litho Rubine D4566DD, 413 grams of methylene chloride and 32 grams of a release polymer composed of 4 mole % of the sodium salt of the dimethyl ester of 5-sulfo-1,3-benzene dicarboxylic acid, 28 mole % of 3a, 4, 7a-tetrahydro-5-methyl-1,3-isobenzofurandione, 41 mole % of 2,2-dimethyl-1,3-propanediol and 27 mole % of the dimethyl ester of benzene dicarboxylic acid, to a ceramic ball mill containing steel beads as the milling media and milling overnight.

Solution #10

This solution was prepared by dissolving 30 grams of Photopolymer #1 in 345 grams of methylene chloride and adding 700 milligrams of the sensitizer 3-benzoyl-5,7-dipropoxycoumarin.

EXAMPLE 1

A donor element with a structure of the type illustrated in FIG. 1 was prepared using as the support a biaxially oriented polyethylene terephthalate film with a thickness of 0.1 millimeters that had been subbed with a vinylidene chloride/acrylic acid/acrylamide terpolymer. By use of an extrusion hopper, the support was coated on one side with coating solution #1 at a wet laydown of approximately 67 grams per square meter and dried to form a print-out layer with a thickness of approximately 2.5 micrometers. The print-out layer was overcoated with solution #3 at a wet laydown of approximately 33 grams per square meter and dried to form an imaging layer with a thickness of approximately 2.5 micrometers.

EXAMPLE 2

A donor element with a structure of the type illustrated in FIG. 2 was prepared using the same subbed support as is described in Example 1. By use of an extrusion hopper, the support was coated on one side with coating solution #1 at a wet laydown of approximately 67 grams per square meter and dried to form a print-out layer with a thickness of approximately 2.5 micrometers and then coated on the opposite side with solution #3 at a wet laydown of approximately 33 grams per square meter and dried to form an imaging layer with a thickness of approximately 2.5 micrometers.

EXAMPLE 3

A donor element with a structure of the type illustrated in FIG. 3 was prepared using the same subbed support as described in Example 1. By use of an extrusion hopper, the support was coated on one side with solution #2 at a wet laydown of approximately 45 grams per square meter and dried to form a print-out layer with a thickness of approximately 2.5 micrometers. The print-out layer was overcoated with solution #4 at a wet laydown of 54 grams per square meter and dried to form a first imaging layer with a thickness of approximately 4 micrometers. The first imaging layer was overcoated with solution #5 at a wet laydown of 27 grams per square meter and dried to form a second imaging layer with a thickness of approximately 2 micrometers.

EXAMPLE 4

A donor element with a structure of the type illustrated in FIG. 3 but with the print-out layer formed from a print-out silver halide emulsion was prepared using the support described in Example 1 but provided with an additional gel sub layer. By use of an extrusion hopper, the support was coated with solution #8 in an amount sufficient to provide a print-out layer with a silver coverage of 2 grams per square meter. The dried print-out layer was overcoated with solution #6 at a wet laydown of 27 grams per square meter and dried to form a first imaging layer with a thickness of approximately 2 micrometers. The first imaging layer was overcoated with solution #7 at a wet laydown of approximately 15 grams per square meter and dried to form a second imaging layer with a thickness of approximately 1.1 micrometers.

EXAMPLE 5

A donor element with a structure of the type illustrated in FIG. 5 was prepared using the same subbed support as described in Example 1. By use of an extrusion hopper, the support was coated with solution #1 at a wet laydown of approximately 67 grams per square meter and dried to form a print-out layer with a thickness of approximately 2.5 micrometers. The print-out layer was overcoated with solution #9 at a wet laydown of approximately 33 grams per square meter and dried to form a pigmented release layer with a thickness of approximately 2.5 micrometers. The pigmented release layer was overcoated with solution #10 at a wet laydown of approximately 33 grams per square meter and dried to form an imaging layer with a thickness of approximately 2.5 micrometers.

COMPARATIVE EXAMPLE A

A donor element which is outside the scope of the present invention because it lacked a print-out layer was prepared using the same subbed support as described in Example 1. By use of an extrusion hopper, the support was coated with solution #5 at a wet laydown of approximately 40 grams per square meter and dried to form an imaging layer with a thickness of approximately 3 micrometers.

The donor elements of Examples 1 to 5 and of Comparative Example A were exposed for 20 units on the high setting of a NuArc Contact Frame with a 5000 watt iron-doped metal halide bulb. A step tablet with a density range of 2.15 was used to evaluate the density of the print-out image. The elements were exposed through the step tablet, read on an X-Rite densitometer, zeroed, and read through a Wratten 8 yellow filter. The density values reported are ortho transmission values. Results obtained are summarized in Table I below.

TABLE I

| Example No. | $D_{min}$ | $D_{max}$ | Print-Out Density |
|---|---|---|---|
| 1 | 1.128 | 1.145 | 0.017 |
| 2 | 1.100 | 1.128 | 0.028 |
| 3 | 0.749 | 0.769 | 0.020 |
| 4 | 0.507 | 0.768 | 0.261 |
| 5 | 0.970 | 1.002 | 0.032 |
| A | 1.061 | 1.061 | 0.000 |

As indicated by the data in Table I, the best print-out image was obtained with Example 4 which utilized a print-out silver halide emulsion. Print-out images effective for use in image registration were also obtained in Examples 1–3 and 5, each of which utilized a leuco dye in the print-out layer. Comparative Example A, which is outside the scope of the present invention, did not employ a print-out layer and therefore no print-out image was obtained.

The invention has been described in detail, with particular reference to certain preferred embodiments thereof, but it should be understood that variations and modifications can be effected within the spirit and scope of the invention.

We claim:

1. A multilayer donor element that is useful in a dry color proofing process in which a colored image is transferred from said donor element to a receiver by a process of lamination; said donor element containing a colorant, dispersed throughout at least one layer which undergoes imagewise transfer, and comprising:
   (1) a support;
   (2) a photosensitive imaging layer comprised of a photohardenable or phototackifiable composition whose tackifying temperature is selectively changeable by imagewise exposure of said donor element to activating radiation; and
   (3) a print-out layer comprised of a print-out composition that functions to form a visible image as a result of said imagewise exposure.

2. A donor element as claimed in claim 1, wherein said colorant is a yellow pigment.

3. A donor element as claimed in claim 1, wherein said colorant is a magenta pigment.

4. A donor element as claimed in claim 1, wherein said colorant is a cyan pigment.

5. A donor element as claimed in claim 1, wherein said colorant is a black pigment.

6. A donor element as claimed in claim 1, wherein said support is a polyester film.

7. A donor element as claimed in claim 1, wherein said support is a polyethylene terephthalate film.

8. A donor element as claimed in claim wherein said print-out layer is on the same side of said support as said imaging layer.

9. A donor element as claimed in claim 1, wherein said print-out layer and said imaging layer are on opposite sides of said support.

10. A donor element as claimed in claim 1, wherein said imaging layer is a photohardenable layer containing a photocrosslinkable polymer.

11. A donor element as claimed in claim 1, wherein said imaging layer is a photohardenable layer containing a photocrosslinkable p-phenylene diacrylate polyester.

12. A donor element as claimed in claim 1, wherein said imaging layer is a photohardenable layer containing a blend of a low Tg crystalline photocrosslinkable polymer with a compatible high Tg amorphous photocrosslinkable polymer.

13. A donor element as claimed in claim 1, wherein said print-out layer is a silver halide emulsion layer.

14. A donor element as claimed in claim 1, wherein said print-out layer is comprised of a print-out composition dispersed in a polymeric binder, said print-out composition comprising (a) a leuco form of a dye having one or more removable hydrogen atoms, the removal of which forms a compound colored differently from said leuco form, and (b) a photooxidant.

15. A multilayer donor element that is useful in a dry color proofing process in which a colored image is transferred from said donor element to a receiver by a process of lamination; said donor element comprising a support having, in order, on one side thereof:
   (1) a print-out layer;
   (2) a first photosensitive imaging layer comprised of a photohardenable composition whose tackifying temperature is selectively changeable by imagewise exposure of said donor element to activating radiation; and (3) a second photosensitive imaging layer comprised of a photohardenable composition whose tackifying temperature is selectively changeable by imagewise exposure of said donor element to activating radiation, said second photosensitive imaging layer having a colorant dispersed therein; said print-out layer comprising a print-out composition that functions to form a visible image as a result of said imagewise exposure.

16. A donor element as claimed in claim 15, wherein said first photosensitive imaging layer contains a blend of a low Tg crystalline photocrosslinkable polymer with a compatible high Tg amorphous photocrosslinkable polymer.

17. A donor element as claimed in claim 15, wherein said first photosensitive imaging layer has a thickness that is at least twice that of said second photosensitive imaging layer.

18. A multilayer donor element that is useful in a dry color proofing process in which a colored image is transferred from said donor element to a receiver by a process of lamination; said donor element comprising a support having a backing layer on one side thereof and having, in order, on the opposite side thereof:
(1) a print-out layer;
(2) a first photosensitive imaging layer comprised of a photohardenable composition whose tackifying temperature is selectively changeable by imagewise exposure of said donor element to activating radiation; and
(3) a second photosensitive imaging layer comprised of a photohardenable composition whose tackifying temperature is selectively changeable by imagewise exposure of said donor element to activating radiation, said second photosensitive imaging layer having a colorant dispersed therein; said print-out layer comprising a print-out composition that functions to form a visible image as a result of said imagewise exposure.

19. A donor element as claimed in claim 18, wherein said backing layer comprises an organopoly-siloxane polymer.

20. A multilayer donor element that is useful in a dry color proofing process in which a colored image is transferred from said donor element to a receiver by a process of lamination; said donor element comprising a support having, in order, on one side thereof:
(1) a print-out layer;
(2) a release layer; and
(3) a photosensitive imaging layer comprised of a photohardenable composition whose tackifying temperature is selectively changeable by imagewise exposure of said donor element to activating radiation, said photosensitive imaging layer having a colorant dispersed therein; said release layer adhering more strongly to said print-out layer than to said photosensitive imaging layer; and said print-out layer comprising a print-out composition that functions to form a visible image as a result of said imagewise exposure.

21. A multilayer donor element that is useful in a dry color proofing process in which a colored image is transferred from said donor element to a receiver by a process of lamination; said donor element comprising a support having, in order, on one side thereof:
(1) a print-out layer;
(2) a release layer; and
(3) a photosensitive imaging layer comprised of a photohardenable composition whose tackifying temperature is selectively changeable by imagewise exposure of said donor element to activating radiation, at least one of said photosensitive imaging layer and said release layer having a colorant dispersed therein; said release layer adhering more strongly to said imaging layer than to said print-out layer, and said print-out layer comprising a print-out composition that functions to form a visible image as a result of said imagewise exposure.

22. A method for preparing a prepress color proof in which colored images are successively transferred from donor elements to a receiver by a process of lamination so as to form a multicolor image on said receiver, said method comprising the steps of:
(1) providing a receiver;
(2) providing four multilayer donor elements each of which comprises:
(a) a support,
(b) a photosensitive imaging layer comprised of a photohardenable or phototackifiable composition whose tackifying temperature is selectively changeable by imagewise exposure of said donor element to activating radiation; and
(c) a print-out layer comprised of a print-out composition that functions to form a visible image as a result of said imagewise exposure; said donor elements containing, respectively, yellow, magenta, cyan and black colorants dispersed throughout at least one layer that undergoes imagewise transfer to said receiver;
(3) imagewise exposing to activating radiation each of said donor elements, and
(4) transferring to said receiver by means of heat and pressure, in succession and in register, either exposed or unexposed areas of said donor elements containing said colorants, registration being accomplished visually with the aid of said visible images formed in said print-out layers.

23. A method as claimed in claim 22, wherein each of said print-out layers is a silver halide emulsion layer.

24. A method for preparing a prepress color proof in which colored images are successively transferred from donor elements to a receiver by a process of lamination so as to form a multicolor image on said receiver; said method comprising the steps of:
(1) providing a receiver;
(2) providing four multilayer donor elements each of which comprises:
(a) a support,
(b) a photosensitive imaging layer, comprised of a photohardenable composition containing a photocrosslinkable polymer and a spectral sensitizer, whose tackifying temperature is selectively changeable by imagewise exposure of said donor element to activating radiation; and
(c) a print-out layer comprised of a print-out composition that functions to form a visible image as a result of said imagewise exposure; said donor elements containing, respectively, yellow, magenta, cyan and black colorants dispersed throughout at least one layer that undergoes imagewise transfer to said receiver;
(3) imagewise exposing to activating radiation each of said donor elements by exposure through corresponding halftone color separation positives of said multicolor image; and (4) transferring to said receiver by means of heat and pressure, in succession and in register, unexposed colored areas of said donor elements, registration being accomplished visually with the aid of said visible images formed in said print-out layers.

25. A method as claimed in claim 24, wherein each of said print-out layers is a silver halide emulsion layer.

26. A method as claimed in claim 25, wherein each of said donor elements comprises a first photosensitive imaging layer which overlies said print-out layer and is free of colorant and a second photosensitive imaging layer which overlies said first photosensitive imaging layer and which contains a colorant.

* * * * *